United States Patent [19]
Rohrer et al.

[11] Patent Number: 5,313,398
[45] Date of Patent: May 17, 1994

[54] METHOD AND APPARATUS FOR SIMULATING A MICROELECTRONIC CIRCUIT

[75] Inventors: Ronald A. Rohrer, Sewickley; Vivek Raghavan, Pittsburgh; J. Eric Bracken, Irwin, all of Pa.

[73] Assignee: Carnegie Mellon University, Pittsburgh, Pa.

[21] Appl. No.: 919,160

[22] Filed: Jul. 23, 1992

[51] Int. Cl.⁵ .............................................. G06F 15/20
[52] U.S. Cl. .................................. 364/468; 364/488; 364/578
[58] Field of Search ............... 364/468, 488, 489, 490, 364/491, 578; 371/23

[56] References Cited

U.S. PATENT DOCUMENTS

| | | | |
|---|---|---|---|
| 4,918,643 | 4/1990 | Wong | 364/802 |
| 5,047,971 | 9/1991 | Horwitz | 364/578 |
| 5,051,911 | 9/1991 | Kimura et al. | 364/468 |
| 5,081,602 | 1/1992 | Glover | 364/578 |
| 5,210,699 | 5/1993 | Harrington | 364/578 X |

OTHER PUBLICATIONS

Raghavan et al., "Awespice: A General Tool for the Accurate and Efficient Simulation of Interconnect Problems"-Proc. 29th ACM/IEEE Design Automation Conference-Abstract-Jun. 8-12, 1992; Anaheim, Calif.

Pillage and Rohrer, "Asymptotic Waveform Evaluation for Timing Analysis", IEEE Transactions on Computer-Aided Design, vol. 9, No. 4, pp. 352-366, Apr. 1990.

Huang, Raghavan and Rohrer, "AWEism: A Program for the Efficient Analysis of Linear(ized) Circuits", Technical Digest of IEEE Internat'l. Conference on Computer-Aided Design, pp. 534-537, Nov., 1990.

Xieand Nakhla, "Delay and Crosstalk Simulation of High-Speed VSLI Interconnects with Nonlinear Terminations", Technical Digest of the IEEE Internat'l. Conference on Computer-Aided Design, pp. 66-69, 1991.

Anastasakis, Gopal, Kim and Pillage, "On the Stability of Moment-Matching Approximations in Asymptotic Waveform Evaluation," Proceedings of 29th ACM-/IEEE Automation Conf., Jun., 1992.

*Primary Examiner*—Joseph Ruggiero
*Attorney, Agent, or Firm*—Bell, Seltzer, Park & Gibson

[57] ABSTRACT

A method and apparatus for simulating a microelectronic circuit includes the steps of storing of a microelectronic circuit or system representation in a computer system and then dividing the circuit or system into portions containing nonlinear elements and linear partitions. The linear partitions are then independently solved for by modelling each linear partition using Asymptotic Waveform Evaluation (AWE) to form multiport admittance macromodels. These macromodels provide admittance and current stencils, which may be functions of time, to a global MNA matrix used by SPICE at each time point to simulate the operation of the entire microelectronic circuit. A linearized transient representation for the nonlinear elements is provided as SPICE admittance and current stencils using conventional techniques. By using AWE techniques to solve the linear partitions separately, significant savings in computation time and improved computational storage efficiency can be achieved.

24 Claims, 10 Drawing Sheets

METHOD AND APPARATUS FOR SIMULATING A MICROELECTRONIC CIRCUIT

FIELD OF THE INVENTION

This invention relates to the design and manufacture of microelectronic circuits and systems, and more particularly to simulators for evaluating the performance of a microelectronic circuit or system prior to fabrication of the circuit or system.

BACKGROUND OF THE INVENTION

Simulation has long been an essential step in the design and manufacture of microelectronic circuits and systems. Present day Ultra-Large Scale Integration (ULSI) devices may include hundreds of thousands or millions of active electronic devices ("transistors") on an integrated circuit chip, which are interconnected on the chip to perform a particular function. The large capital investment required to fabricate microelectronic devices and the difficulty in reworking microelectronic devices which do not operate as planned, have produced the need to simulate circuit performance before manufacture.

Accordingly, many simulators have been developed and marketed. One widely used circuit simulator is a program which was developed at the Electronics Research Laboratory of the University of California, Berkeley, known as SPICE. In general, SPICE is a system for simulating nonlinear circuits in time, using nonlinear time-independent generalized admittance representations. A popular version of SPICE (SPICE 2) is described in "SPICE Version 2G.6 User's Guide" Berkeley: University of California, Department of Electrical Engineering and Computer Science, 1980 by Vladimirescu et al.

Circuit simulators have also been the subject of patent protection because they are an integral part of the design and fabrication of microelectronic devices. Recently issued patents concerning circuit simulators are U.S. Pat. No. 4,918,643 to Wong entitled Method and Apparatus for Substantially Improving the Throughput of Circuit Simulators; U.S. Pat. No. 5,047,971 to Horwitz entitled Circuit Simulation; and U.S. Pat. No. 5,051,911 to Kimura et al. entitled Apparatus for Effecting Simulation of a Logic Circuit and Method for Producing a Semmiconductor Device Using the Simulation Approach.

Circuit simulators are typically software based, and are designed to accept a description of the circuit which defines the circuit topology and element values. Each element in the circuit is typically specified by an element line containing the element name, the connecting nodes, and electrical parameter values. Simulators typically simulate circuits which contain passive devices such as resistors, capacitors, diodes, inductors and mutual inductors; stimuli, such as voltage and current sources, and active devices such as bipolar junction transistors (BJT), junction field effect transistors (JFET) and metal oxide semiconductor field effect transistors (MOSFET). The simulator can typically be configured to perform DC analysis, AC small signal analysis and transient analysis.

As the feature sizes of integrated circuits continue to shrink, and operating speeds increase, the characterization of the parasitic effects associated with the interconnect circuit becomes more critical and more difficult. In the past, the delays caused by the interconnects could simply be disregarded when simulating the behavior of the entire integrated circuit. This was because the microelectronic circuit's functional logic devices including logic gates dominated the simulation profile in terms of overall delay. However, as the feature sizes of integrated circuits continue to shrink, the resistance of the circuit's interconnections per unit length increases. This causes an increase in delay, or otherwise offsets the speed advantages obtained using devices having smaller feature sizes.

In addition, the close proximity of metal lines makes the component cross-talk capacitance larger. Even inductance effects, which are evident for boards and multichip modules which comprise microelectronic systems, may be important for modeling the integrated circuit packaging or chip to package interface. Accordingly, a complete circuit simulation of an integrated circuit must now account for the resistive, inductive and capacitive effects of the interconnect paths in addition to simulating the effect of the logic gates and other functional logic devices.

It will be understood by those having skill in the art that a conventional circuit simulator, such as SPICE, could be used for a complete simulation of a microelectronic circuit, including the logic devices and the interconnect paths. However, because of the large numbers of circuit elements in the interconnect portion of the circuit, a complete simulation may become extremely time consuming, and may exceed the storage capabilities of the processing system on which the simulation is run.

A major improvement in the simulation of linear interconnects is described in a publication by Lawrence T. Pillage and Ronald A. Rohrer entitled Asymptotic Waveform Evaluation for Timing Analysis, IEEE Transactions on Computer-Aided Design, Vol. 9, No. 4, April 1990, pp. 352–366, the disclosure of which is hereby incorporated herein by reference. Described is an Asymptotic Waveform Evaluation (AWE) methodology to provide a generalized approach to linear resistor-inductor-capacitor (RLC) circuit or system response approximations. AWE is a general method for computing a qth order approximate model of a circuit or system, and can be obtained by computing 2g moments of the circuit or system and matching these moments to the circuit's or system's impulse response. The moments, in their simplest interpretation, represent the coefficients of the powers of s in the Taylor series expansion of the homogeneous circuit response. Once the desired number of moments is found, they may be mapped to the approximate dominant poles of the lower order approximating system. The corresponding residues are then computed using the poles and moments. Once the residues of the approximate response are found, the time domain response of an interconnect circuit, for example, may be determined.

In the AWE technique, moments of a circuit may be generated by successively solving an equivalent DC circuit with all capacitors replaced by current sources and all inductors replaced by voltage sources. The resulting voltages across the capacitors and currents through the inductors comprise one generation of circuit moments. Initially, all capacitor-current sources and inductor-voltage sources are set to zero, and independent voltage and current sources of the actual circuit are set to their final values. For subsequent moment generations, each capacitor-current source is set to the product of its capacitance and its previous moment, while each inductor-voltage source is set to the product of its inductance and its previous moment. This process may be continued until the desired order of approximation is obtained. It has been shown that, for large numbers of interconnects, AWE can provide more than a hundredfold speed increase compared to a conventional SPICE circuit simulation.

In order to provide a complete analysis of a microelectronic circuit, not only must the behavior of the linear interconnects be included, the behavior of the nonlinear portions of the circuit must be included as well. Typical nonlinear aspects of a microelectronic circuit include, for example, the presence of nonlinear drivers, nonlinear loads and nonlinear transmission elements such as pass transistors, as part of the circuit. The occurrence of these types of nonlinear aspects in conjunction with the interconnect circuit is especially prevalent in present-day technologies where a single interconnect net can be expected to travel through a nonlinear buffer, through chip-packaging to traces on a multichip module (MCM) or printed circuit board (PCB), and back onto a another integrated circuit through packaging and to a nonlinear load, for example. Thus, while interconnect problems are largely linear, complete analysis requires the inclusion of the nonlinear portions of the interconnect circuit as well.

The AWE technique, however, is limited to the solution of linear circuits only. Consequently, improved techniques for solving nonlinear portions of the circuit in conjunction with the interconnect circuit need to be developed to provide accurate transient analysis of the entire microelectronic circuit.

SUMMARY OF THE INVENTION

It is therefore an object of the present invention to provide an improved method and apparatus for simulating the behavior of a microelectronic circuit, including linear and nonlinear portions of the interconnect circuit.

It is another object of the present invention to provide an improved method and apparatus for simulating the behavior of a microelectronic circuit which utilizes established standards for the simulation of nonlinear elements.

These and other objects are provided, according to the present invention, by exploiting the efficiency and accuracy of Asymptotic Waveform Evaluation (AWE) for the linear portions of a microelectronic circuit while using the tried and tested linearized, time-dependent generalized admittance simulator (SPICE) for the nonlinear portions of the circuit. The combined simulator, referred to as AWESpice, significantly reduces the simulation time for a complete microelectronic circuit by using AWE for the linear portions and SPICE for the nonlinear portions instead of using SPICE for the entire microelectronic circuit.

In particular, a representation of the microelectronic circuit is stored in a computer system. The stored representation is then divided into a first circuit of linear elements and a second circuit including nonlinear elements. The second circuit may also include linear elements not included in the first circuit. The first circuit is then divided into multiple partitions having multiple ports, if necessary.

Using AWE, the moments, poles and residues are determined for each partition in the first circuit and then a multiport admittance macromodel ("macromodel") is created therefrom for each partition. Using the macromodels from the first circuit and the elements of the second circuit, a linearized time-dependent global circuit matrix is constructed for the entire circuit. The global matrix includes the effects of the second circuit by using a linearized admittance representation including admittance and current stencils, at each simulation time point. These stencils are determined using an integration technique and a linearization technique which linearizes the characteristics of the nonlinear elements of the second circuit at each simulation time point. The operation of the first circuit can be included by also forming a transient admittance representation from the macromodels.

By combining the admittance representation for each macromodel of the first (linear) circuit and the admittance and current stencils from the second (nonlinear) circuit at each time point, a time domain simulation of the entire microelectronic circuit can be obtained. Moreover, the admittance macromodels created using AWE can be treated as SPICE compatible multiterminal device models, and can be provided as "inputs" to SPICE to form a time domain simulation of the interconnect circuit as well as the entire microelectronic circuit including functional logic devices.

One vehicle for using an AWE macromodel as an input to SPICE is the SPICE stencil. In particular, and as well known to those having skill in the art, SPICE simulates a nonlinear circuit by obtaining a DC solution and a transient solution. The DC solution is obtained by linearizing the nonlinear elements using Norton equivalent circuits, obtaining a DC stencil therefrom, and iteratively solving the DC circuit using the DC stencil until convergence is obtained. The transient solution is obtained by linearizing the nonlinear elements, using an integration technique to obtain a transient stencil therefrom and solving the transient circuit using the transient stencil until convergence is obtained. Thus, using conventional SPICE techniques, a linearized admittance representation including DC and transient stencils can be generated for the second circuit.

According to the present invention, the macromodels from the first circuit are converted into SPICE compatible DC and transient stencils. The DC stencils are then combined with the DC stencils from the second circuit to solve for the DC operation of the entire microelectronic circuit. Similarly, the transient stencils from the first circuit are combined with those from the second circuit to solve for the microelectronic circuit's transient operation. Accordingly, the AWE macromodels are converted into DC and transient stencils, which are usable by SPICE along with the DC and transient stencils from the second circuit, to produce a simulation of the entire interconnect and microelectronic circuit.

DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

1. Introduction - Computer Aided Microelectronic Circuit Design and Manufacture

Figure 1:
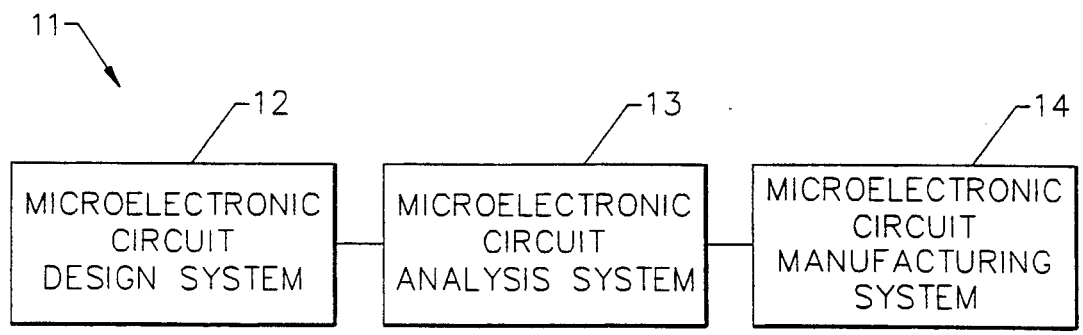
FIG. 1 illustrates a functional block diagram of a computer aided microelectronic circuit design and manufacturing system.

Referring now to FIG. 1, a functional block diagram of a computer aided microelectronic circuit design and manufacturing system 11 is shown. The system includes three general subsystems: a microelectronic circuit design system 12, a microelectronic circuit analysis system 13 and a microelectronic circuit manufacturing system 14.

The microelectronic circuit design system 12 may include circuit libraries or macros for such elements as logic gates, registers, processors and memory elements. Also typically included is a checking system which insures that the design meets the overall constraints and design rules which are compatible with the manufacturing system 14. Once it is ensured that a functional design is present, a wiring program may determine the actual wiring interconnect paths between the elements of the microelectronic circuit.

The microelectronic circuit analysis system 13 is typically employed near the end of the design process and acts as an independent verification of the operation of the design, and as a means by which relatively subtle parameter optimization can be performed. As already described, SPICE is a general purpose circuit simulation program for nonlinear DC, nonlinear transient, and linear AC analysis. Circuits may contain resistors, capacitors, inductors, mutual inductors, independent voltage or current sources, and the foremost semiconductor devices: diodes, BJTs, JFETs and MOSFETs.

After the parameters of the microelectronic circuit design are optimized using the microelectronic circuit analysis system, the parameters are provided to a microelectronic circuit manufacturing system 14 in order to produce the integrated circuit. The microelectronic circuit manufacturing system may generate the required masks, and may control the manufacturing tools for performing the various processes on semiconductor wafers, and may perform other functions to produce integrated circuit chips.

It will be understood by those having skill in the art that the microelectronic circuit design system 12, microelectronic circuit analysis system 13 and various parts of the microelectronic circuit manufacturing system 14 may be realized as software modules running on a computer system. Alternatively, stand alone systems may be provided. The general design and operation of systems 12, 13, and 14 are well known to those having a skill in the art and need not be described further herein.

2. Hardware Environment of Microelectronic Circuit Simulator

Figure 2:
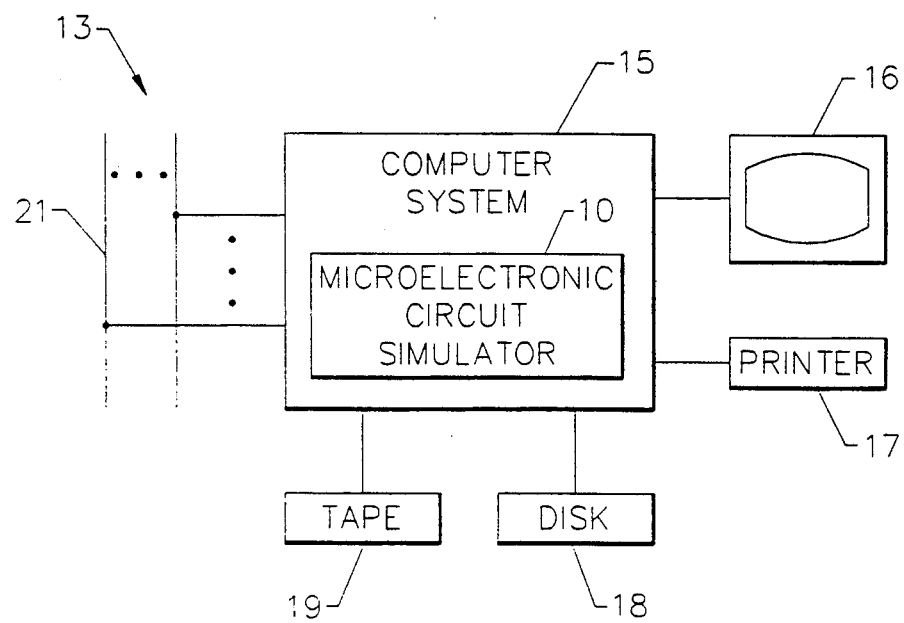
FIG. 2 illustrates a general hardware description of the microelectronic circuit analysis system illustrated in FIG. 1.

Referring now to FIG. 2, a general hardware description of the microelectronic circuit analysis (or simulator) system 13 (FIG. 1) will be described. As shown in FIG. 2, the microelectronic circuit analysis system 13 includes a computer system 15 which may be a mainframe, minicomputer, workstation or a personal computer. The computer system may include a number of software subsystems running thereon. Examples of such software subsystems may be a SPICE program. Another subsystem running on computer system 15 is the microelectronic circuit simulator 10 of the present invention.

The circuit simulator 10 may accept a representation of a microelectronic circuit via a tape input 19, disk input 18, or via a data bus 21 which may interface to the microelectronic circuit design system 12 (FIG. 1). A display 16 and printer 17 may be used to provide results of the microelectronic circuit simulation. The results may also be communicated back to the microelectronic circuit design system 12 or microelectronic circuit manufacturing system 14 (FIG. 1) via tape 19, disk 18 or data bus 21.

The hardware design of microelectronic circuit analysis system 13 is well known to those having skill in the art and need not be described further.

As one example, the microelectronic circuit simulator of the present invention may be run on a computer system including a Digital Equipment Company (DEC) Station 5000 or an IBM RS-6000.

3. Overview of Microelectronic Circuit Simulator, 10

Figure 3:
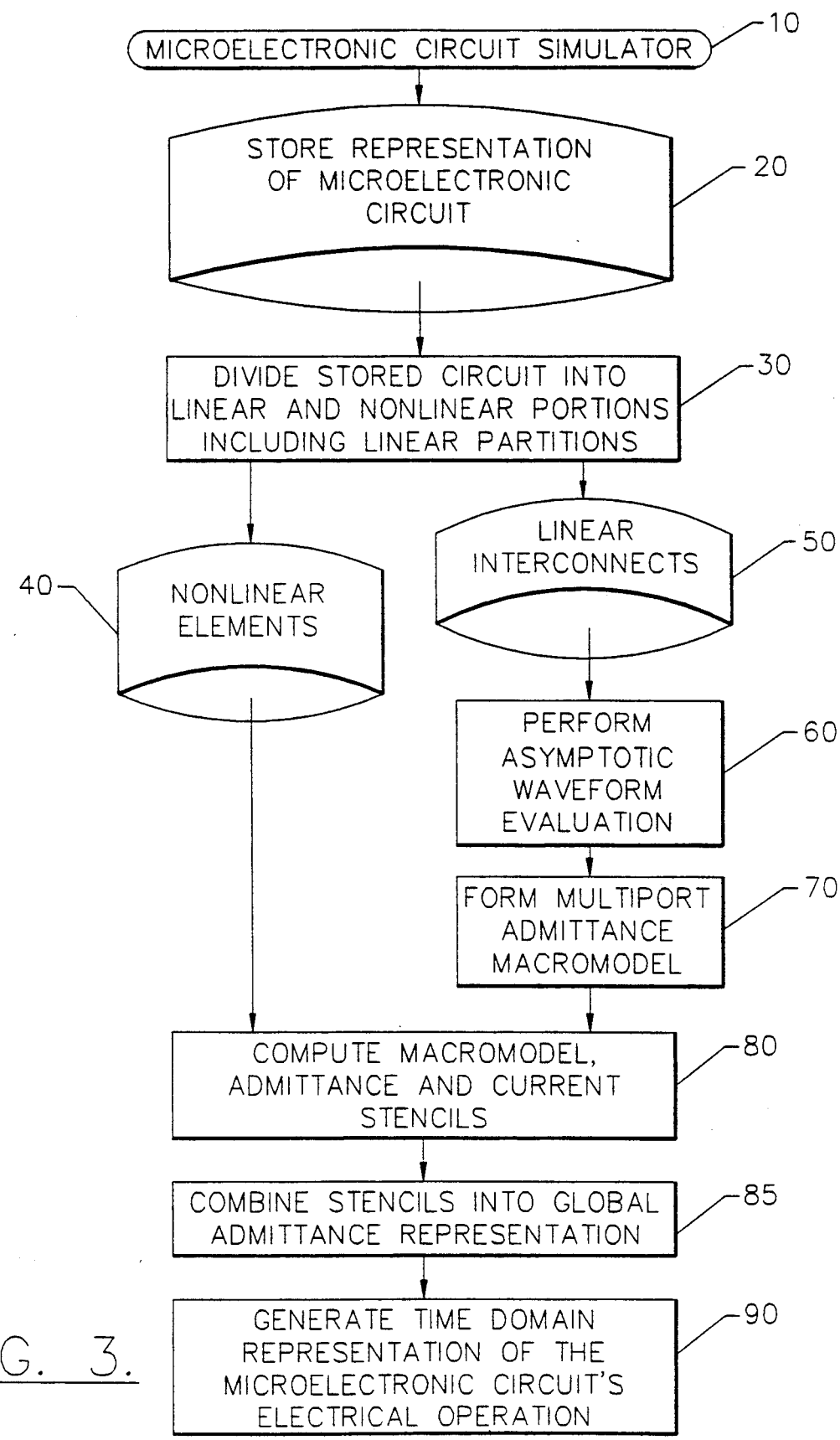
FIG. 3 illustrates the operations performed by the microelectronic circuit simulator illustrated in FIG. 2.

Referring now to FIG. 3, there is illustrated an overview of the operations performed by a microelectronic circuit simulator 10 according to the present invention. Each of these operations will be described in detail in subsequent sections. As shown, the first operation comprises storing a representation of the microelectronic circuit at Block 20 using conventional techniques. The representation of the microelectronic circuit includes a representation of the active devices and the linear and nonlinear interconnect elements. It will be understood by those having skill in the art that the entire microelectronic circuit may be described in terms of a "netlist" which defines the component types, component values and connecting nodes for all the components.

Then, as shown in Block 30, the stored circuit is divided into nonlinear element portions 40 and linear interconnect partitions 50. Moment matching techniques are used to perform an Asymptotic Waveform Evaluation (AWE) of the linear interconnect partitions at Block 60, and a multiport admittance macromodel is formed, at Block 70.

A linear network containing two ports excited by $V_1$ and $V_2$, respectively, can be characterized by four port variables. Using short-circuit admittance or y-parameter characterization, for example, a linear two port network can be described by two equations:

$$I_1 = y_{11}V_1 + y_{12}V_2 \quad (1)$$

$$I_2 = y_{21}V_1 + y_{22}V_2 \quad (2)$$

Here, $I_1$ and $I_2$ are the first and second port currents, respectively, and the four parameters $y_{11}$, $y_{12}$, $y_{21}$, and $y_{22}$ are admittances. Accordingly, an admittance parameter matrix equation $Y(s)V(s) = I(s)$ for a multiport linear circuit can be expressed using the following matrix notation:

$$\begin{bmatrix} Y_{11}(s) & \cdots & \cdots & Y_{1n}(s) \\ \cdots & \cdots & \cdots & \cdots \\ \cdots & \cdots & \cdots & \cdots \\ Y_{n1}(s) & \cdots & \cdots & Y_{nn}(s) \end{bmatrix} \begin{bmatrix} V_1(s) \\ \cdots \\ \cdots \\ V_n(s) \end{bmatrix} = \begin{bmatrix} I_1(s) \\ \cdots \\ \cdots \\ I_n(s) \end{bmatrix} \quad (3)$$

where V(s) and I(s) correspond to the port voltage and current vectors, respectively.

Admittance parameters have been chosen because they fit naturally into the Modified Nodal Analysis scheme used by SPICE and can be used as stencils to include the operation of the first circuit containing linear elements. As known to those skilled in the art, the four admittances completely characterize the linear two-port network. Additional information regarding the characterization of multiport linear networks can be obtained in many introductory electronic circuit textbooks and is provided in a text by Adel Sedra and Kenneth Smith, entitled Microelectronic Circuits, published by Holt, Rinehart and Winston, 2nd Edition, 1987, Appendix B, pp. 1-3.

As shown at Block 80, macromodel stencils for the first circuit are computed, and conventional SPICE techniques may be used to compute a linearized admittance representation including admittance and current stencils for the second circuit. These stencils are then combined into a global admittance representation for the entire circuit, Block 85, and then a time domain waveform of the entire microelectronic circuit's electrical operation is generated at Block 90 using conventional techniques.

Accordingly, as shown, an Asymptotic Waveform Evaluation (AWE) technique is used to solve each linear partition in the first circuit, and create a multiport macromodel therefrom. From these models, stencils for each simulation time point are generated and inserted into a SPICE compatible global admittance matrix to obtain a global admittance representation. Stencils corresponding to the nonlinear and other linear portions of the circuit are also included. Conventional SPICE techniques are then used to solve the global admittance representation at each simulation time point and to provide a time domain simulation of the interconnect circuit and the entire microelectronic circuit.

By using admittance macromodels in place of performing a full SPICE analysis for all the linear interconnects, substantial reductions in the use of computer memory can be achieved. Moreover, substantial savings in computation time can also be achieved since the formation of partitions and macromodels and the solution therefrom can be obtained more efficiently using AWE.

Having described the general overview of the microelectronic circuit simulator 10 of the present invention, a detailed description will now follow. The detailed description will be preceded by a general description of SPICE and a conventional technique for generating and inserting admittance and current stencils into a nodal equation matrix. A description of Asymptotic Waveform Evaluation (AWE) and the operations of FIG. 3 will also be described in detail in subsequent sections.

4. Overview of Circuit Simulation: SPICE

SPICE uses a Modified Nodal Analysis (MNA) and the trapezoidal integration technique for solving microelectronic circuits having linear and nonlinear circuit elements. As will be understood by one skilled in the art, a complete set of nodal admittance equations for a circuit can be obtained by stencilling in the branch contributions on an element-by-element basis. This use of stencils can be shown by the solution of the resistor ladder example shown in FIG. 4.

Figure 4:
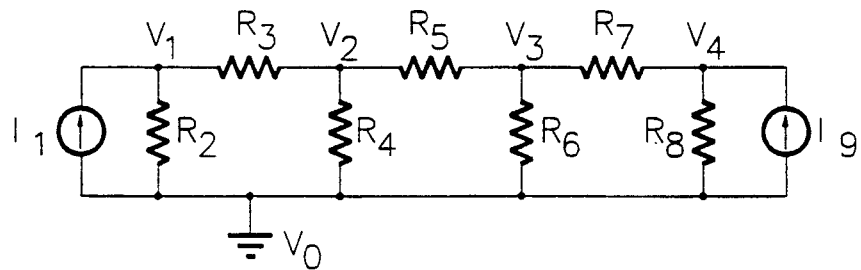
FIG. 4 illustrates an electrical schematic of an example circuit having linear elements.

The solution of the example circuit begins with the formation of a netlist description of the circuit from its graphical representation provided in FIG. 4. The computer simulator obtains the graphical representation through a form of schematic capture or other conventional technique for obtaining the circuit description. The netlist description for the resistor ladder circuit is provided as:

| Branch Name | From Node | To Node | Value |
|---|---|---|---|
| I1 | 0 | 1 | 1.0 |
| R2 | 1 | 0 | 1.0 |
| R3 | 1 | 2 | 1.0 |
| R4 | 2 | 0 | 1.0 |
| R5 | 2 | 3 | 1.0 |
| R6 | 3 | 0 | 1.0 |
| R7 | 3 | 4 | 1.0 |
| R8 | 4 | 0 | 1.0 |
| R9 | 0 | 4 | 1.0 |

By using the admittance relation $Yv = I$, where Y is an $n \times n$ nodal admittance matrix, I is the vector of current source inputs, and v is the vector of node voltages, it can be seen that resistor branches R2-R8 contribute terms to y and current branches I1 and I9 contribute terms to I. From the input list, these contributions can be characterized on a branch-by-branch basis in terms of element stencils. For example, given a resistor $R_k$ between nodes i and j in the circuit, a positive conductance value is added to the matrix locations (i,i) and (i,j) while a negative value is added to (i,j) and (j,i). In addition, for a 1-amp current branch directed from node i to node j, a positive current source value is added to the ith entry of I and a negative value is added to the jth entry. These stencils are provided in TABLE 1. The current stencil values are made opposite if the current vector is placed on the right hand side as provided by Equation (4).

TABLE 1

|  | From Node (ith column) | To Node (jth column) | Current Source |
|---|---|---|---|
| From Node (ith row) | $\frac{1}{R_k}$ | $\frac{-1}{R_k}$ | $I_n$ |
| To Node (jth row) | $\frac{-1}{R_k}$ | $\frac{1}{R_k}$ | $-I_n$ |

The overall set of nodal admittance equations can be obtained by stencilling in the branch contributions on an element by element basis to obtain the following global admittance representation:

$$\begin{bmatrix} \left(\frac{1}{R_2}+\frac{1}{R_4}+\frac{1}{R_6}+\frac{1}{R_8}\right) & -\frac{1}{R_2} & -\frac{1}{R_4} & -\frac{1}{R_6} & -\frac{1}{R_8} \\ -\frac{1}{R_2} & \left(\frac{1}{R_2}+\frac{1}{R_3}\right) & -\frac{1}{R_3} & 0 & 0 \\ -\frac{1}{R_4} & -\frac{1}{R_3} & \left(\frac{1}{R_3}+\frac{1}{R_4}+\frac{1}{R_5}\right) & -\frac{1}{R_5} & 0 \\ -\frac{1}{R_6} & 0 & -\frac{1}{R_5} & \left(\frac{1}{R_5}+\frac{1}{R_6}+\frac{1}{R_7}\right) & -\frac{1}{R_7} \\ -\frac{1}{R_8} & 0 & 0 & -\frac{1}{R_7} & \left(\frac{1}{R_7}+\frac{1}{R_8}\right) \end{bmatrix} \begin{bmatrix} v_0 \\ v_1 \\ v_2 \\ v_3 \\ v_4 \end{bmatrix} = \begin{bmatrix} -I_1 - I_9 \\ I_1 \\ 0 \\ 0 \\ I_9 \end{bmatrix} \quad (4)$$

Because the construction of the inverse of Y ($Y^{-1}$) is computationally complex, SPICE uses a direct method for solving sets of linear equations simultaneously, known as LU-factorization. As will be understood by one skilled in the art, the transient analysis of linear circuits and the DC and transient analysis of nonlinear circuits rely heavily on successive computations by a linear system solver as explained herein.

SPICE performs a DC analysis of a nonlinear circuit by first linearizing the nonlinear behavior of each nonlinear element about a presumed operating point. This operation is initialized by "guessing" the circuit's voltages and currents. Next, linearized Norton equivalents are obtained for each element about the element's presumed operating point and then nodal equations characterizing the linear circuit are formulated using conventional techniques. These equations are solved to obtain the new presumed operating points and the process is repeated. If the changes in presumed operating points between successive computations is sufficiently small, convergence is obtained and the process is stopped. As will be understood by one skilled in the art, the linearized Norton equivalents for each element contain the values of the Y-matrix and I-vector stencils. This is because a Norton equivalent is characterized by a single admittance or conductance in parallel with a current source.

SPICE performs a linear transient analysis by using trapezoidal integration approximations for each element's transient behavior. To implement a linear transient analysis, the DC operating conditions or initial conditions are first obtained using conventional DC solution techniques. The computation of these values gives rise to the DC capacitor voltages and inductor currents. Once the DC conditions have been obtained, the time is incremented by the selected transient time interval. The time increment is used to calculate the new voltages and currents throughout the linear circuit using Thevenin and Norton equivalent trapezoidal approximate models and MNA. The new voltages and currents provide the starting conditions for the next time increment and the procedure is again repeated by performing another DC analysis at the new time point.

Nonlinear transient analysis is performed by combining linear transient analysis and nonlinear DC analysis. The procedure begins by determining the nonlinear DC bias point using nonlinear DC analysis. Next, SPICE computes linearized models for all elements about the DC bias point (or the previously determined operating point) and a nonlinear DC analysis is again performed using the simulation time interval ($\Delta t$) and an appropriate integration technique to compute the SPICE stencils therefrom. Nonlinear energy storage elements require both linearization and integration to produce their respective linearized transient stencils. The resulting nonlinear transient circuit is then solved in much the same manner as the nonlinear DC circuit until convergence is achieved at the particular time point. If the simulation end-time has not been reached, the operations are repeated by constructing a new linearized model and repeating the nonlinear DC analysis at the next time point. Once the end time has been reached, a transient response plot can be generated for the entire simulation time period.

5. Asymptotic Waveform Evaluation (AWE)

Asymptotic Waveform Evaluation (AWE) is a technique for approximating the transient response of general linearized interconnect circuits, for example, and involves the matching of 2q moments of the exact circuit response to a q-pole model, characterized by the q most dominant approximate time constants. The model represents an analytical transfer function for the circuit which is useful when responses to repetitive forcing functions are being analyzed. This allows the interconnect characterization to be pre-processed for higher levels of simulation.

The AWE methodology represents a qth order extension of the first-order Elmore delay approximation and can be used to predict a transient waveform at any circuit node. A description of AWE is provided in an article written by Rohrer and Pillage, entitled Asymptotic Waveform Evaluation for Timing Analysis, cited above, and in an article written by Huang, Raghavan and Rohrer, entitled AWEsim: A Program for the Efficient Analysis of Linear(ized) Circuits, published at the International Conference on Computer-Aided Design in November 1990, pp. 534–537, the disclosures of both of which are hereby incorporated herein by reference. As described in these articles, the matching process requires twice as many moments as poles, since q poles and q residues are matched, resulting in 2q unknowns. Moment matching is a Padé approximation which has been applied to various model-order reduction problems as described in a publication entitled Stable Reduced-Order Models Using Padé-Type Approximations, by Y. Shamash, published in IEEE Transactions on Automatic Control, AC-19, pp. 615–16 (1974).

In AWE, the moment matching step is preceded by the calculation of a first set of moments; this occurs by LU-factorization of the equivalent DC circuit matrix. Successive moment calculations involve forward and backward substitutions.

As will be understood by one skilled in the art, the moments represent the coefficients of the powers of s in the Taylor series expansion of the homogeneous response of a stable system. For instance, consider the impulse response at a node, dv/dt (the unit step response is v(t)). Then $$\mathcal{L}(\dot{v}(t)) = H(s) = \int_0^\infty \dot{v}(t)e^{-st}dt \tag{5}$$

Expanding $e^{-st}$ into its Taylor series about $s=0$, $$H(s) = \left[ \int_0^\infty \dot{v}(t)dt - s\int_0^\infty t\dot{v}(t)dt + \frac{s^2}{2!}\int_0^\infty t^2\dot{v}(t)dt - \ldots \right] \tag{6}$$

Where the moments are the coefficients of the s-terms, i.e., $$m_i = \frac{(-1)^i}{i!} \int_0^\infty t^i\dot{v}(t)dt \tag{7}$$

From 2q moments, a unique qth order response is specified. This qth order response, when transformed to its time domain step response equivalent, has the form:

$$v(t) = v_p = k_1 e^{p_1 t} + \ldots k_q e^{p_q t} \tag{8}$$

where $v_p$ is the particular (steady state) solution, $p_i$ is the value of the ith pole, and $k_i$ is the value of the corresponding ith residue.

AWE only requires a single DC circuit analysis to generate a complete set of circuit moments wherein the number of pairs of moments calculated determines the degree of accuracy between the qth order modelled response and the actual response. When a very general technique such as Modified Nodal Analysis (MNA) is used to solve the circuit, there is virtually no limitation on circuit complexity so long as the circuit can be linear(ized).

Having described the AWE and conventional SPICE techniques which are combined to form a complete simulation of a microelectronic circuit, the operations performed by the microelectronic circuit simulator of FIG. 3 will now be described.

6. Store Representation of Microelectronic Circuit, 20

Referring again to FIG. 3, any one of a number of conventional operations for storing a representation of a microelectronic circuit can be used for storing the interconnect circuit to be partitioned in Block 30. SPICE, for example, obtains a netlist description of the circuit from its graphical representation. This operation is performed by using a form of schematic capture or other conventional technique for obtaining the circuit description. The netlist description of the captured circuit should contain, for example, each element's parameter value or description along with the "to" and "from" connecting nodes. If functional logic devices are included in the circuit to be simulated, user defined models for each of the devices should also be included.

7. Divide Stored Circuit Into Linear and Nonlinear Portions Including Linear Partitions, 30

Figure 5:
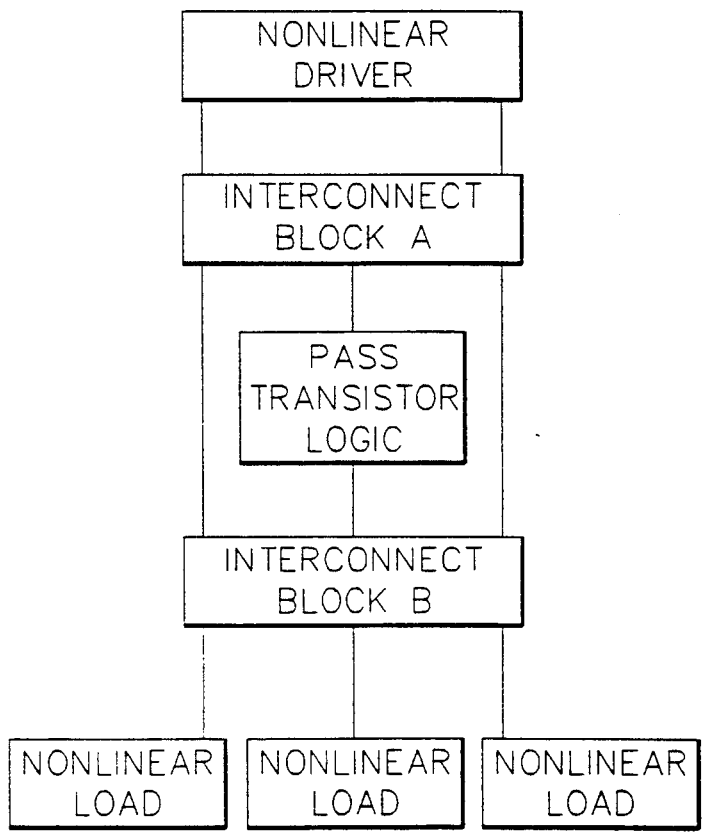
FIG. 5 illustrates a block diagram of a interconnect circuit containing linear and nonlinear portions.

Partitioning is a procedure whereby integral portions of a microelectronic circuit are broken up into reduced circuit representations that can be independently solved. For example, FIG. 5 provides a block diagram of a generalized interconnect circuit having nonlinear elements and linear partitions. The linear partitions and nonlinear elements are individually solved and then combined and solved again to yield the complete circuit response. Partitioning is performed because present day computers have only limited processor and memory resources and may not be able to independently solve an entire circuit in a single solution procedure. In addition to making large circuit solution possible, partitioning also has the benefit of speeding up solutions of circuits having reproducible partitions. Moreover, a cataloging capability can be achieved by individually solving the partitions first and later abstracting them away during the solution of the global circuit containing the individual partitions. This advantage leads to significant memory savings which can be crucial in the solution of very large interconnect circuits, for example.

Figure 6:
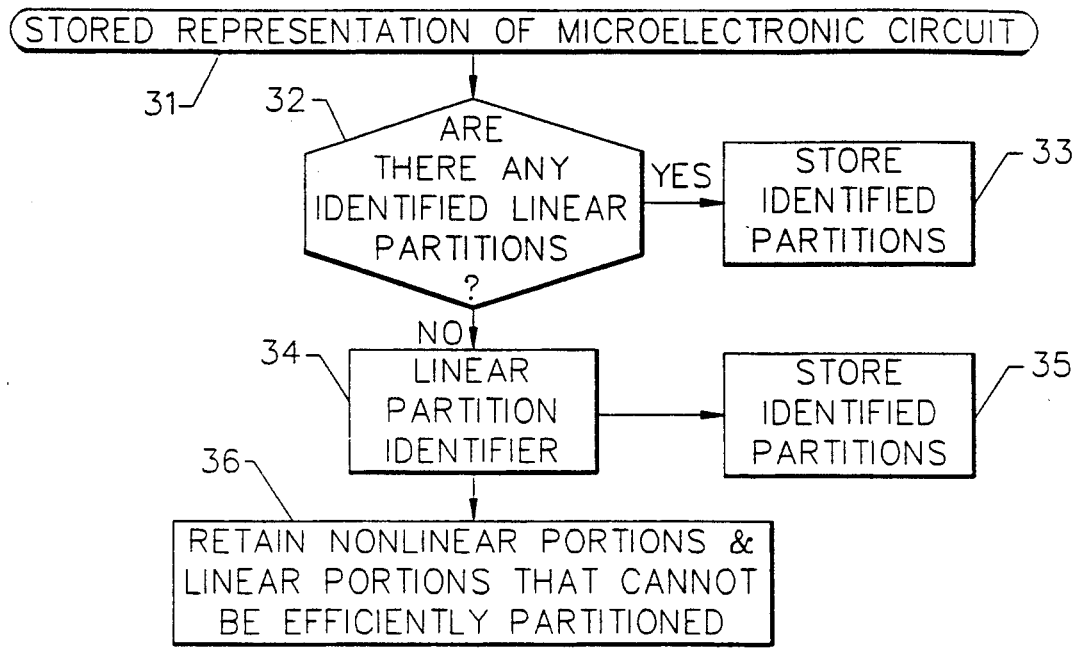
FIG. 6 illustrates the operations for forming linear partitions from a microelectronic circuit containing linear and nonlinear elements.

Referring now to FIG. 6, the operations for partitioning a microelectronic circuit containing both linear and nonlinear elements will now be described. The operations for partitioning a microelectronic circuit containing an interconnect circuit begin with the stored representation of the microelectronic circuit, Block 31. First, the circuit is checked to see if there are any identified linear partitions, Block 32. If so, the identified partitions are stored for further processing, Block 33. If portions of the microelectronic circuit remain after the initial check, the remaining stored representation of the circuit is fed to a linear partition identifier, Block 34, which identifies any and all remaining linear partitions using conventional techniques. If additional linear partitions are found, they are stored, Block 35. The linear and nonlinear portions of the circuit not selected for macromodeling are retained, Block 36; these portions comprise the second circuit. As described below, admittance and current stencils are ultimately generated for the nonlinear portions of the circuit including functional logic devices.

8. Perform Asymptotic Waveform Evaluation to Compute MultiPort Admittance Macromodels, 60, 70

Figure 7:
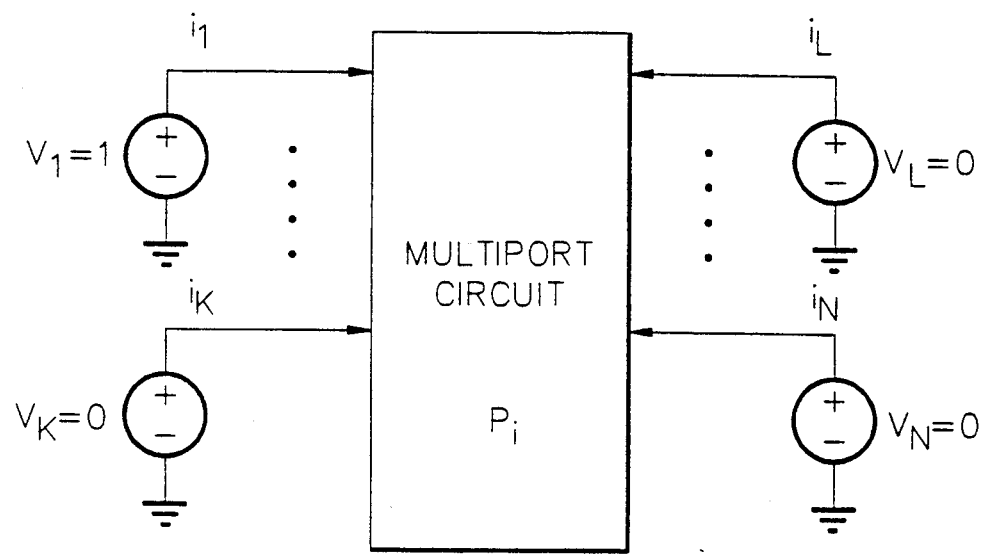
FIG. 7 illustrates a block electrical schematic diagram for determining equivalent y-parameters for a partition containing linear elements.

Using conventional y-parameter determination techniques, as described in Section 3, the admittance parameters for each of the linear partitions can be computed by exciting a single port with a voltage impulse while shorting all other ports and measuring the current entering through each port. A multiport circuit for finding the moments of a particular partition is shown in FIG. 7. Admittance moments for an entire admittance matrix as shown by Equation 3, for example, can be determined by measuring the moments of currents through each of the voltage sources on a source by source basis.

Once the necessary moments have been obtained, a reduced-order pole-residue model for the multiport admittance parameters can be generated using the Padé approximation technique described in Section 5 to convert the $2q_{ij}$ low-order moments for each matrix entry (i,j) of an admittance representation into a $q_{ij}$-pole rational function, in partial fraction form:

$$Y_{ij}(s) = \sum_{r=1}^{q_{ij}} \frac{k_r}{s - p_r} + d_{ij} = [Y_0]_{ij} + s[Y_1]_{ij} + s^2[Y_2]_{ij} + \ldots \quad (9)$$

The poles and number of poles in each approximation need not be the same. Differences in the number of poles for each approximation may arise from the fact that different system functions may require different orders of approximation in order to be modelled accurately.

The (i,j) entry of the impulse response matrix can be determined by taking the inverse Laplace transform of Equation (9) symbolically to obtain the time dependent macromodel for a given admittance matrix entry:

$$y_{ij}(t) = \sum_{r=1}^{q_{ij}} k_r e^{p_r t} + d_{ij} \quad (10)$$

The term $d_{ij}$ in Equations (9) and (10) represents the direct coupling between the input and output. Direct coupling terms are usually found in the diagonal terms of the admittance matrix shown by Equation (3).

Figure 8:
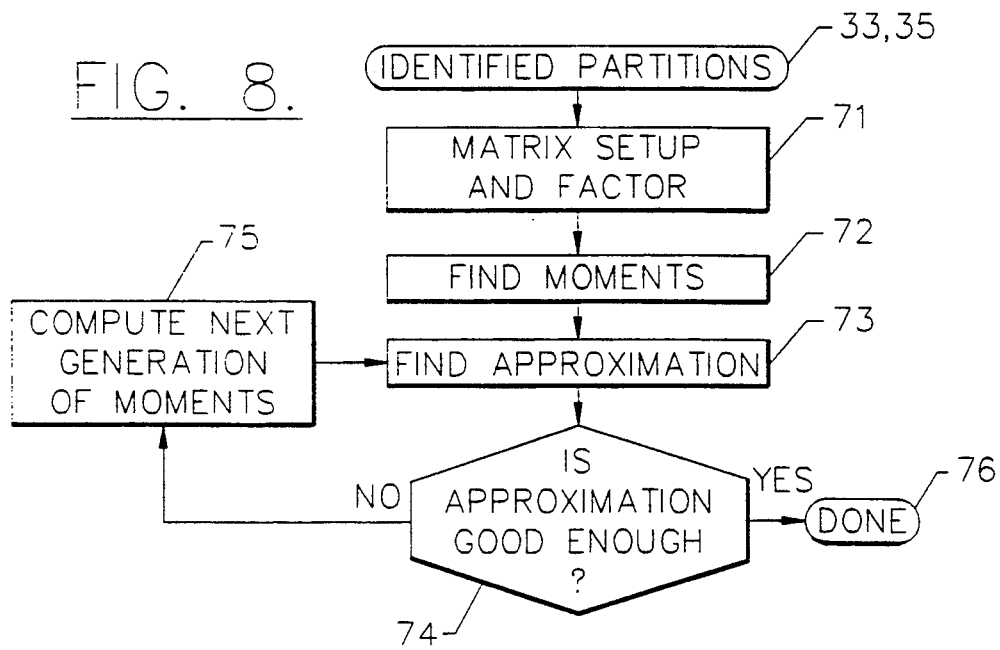
FIG. 8 illustrates the operations for performing Asymptotic Waveform Evaluation.

Referring now to FIG. 8, the steps for computing the AWE model ("macromodel") for each linear partition will be described. First, the admittance matrix for each of the linear partitions 33, 35 is generated and combined into an admittance macromodel matrix 71. Once the admittance macromodel matrix is created for the multiple partitions, two moments are computed for each order of approximation to be included in the macromodel, Block 72. Using these moments, the next higher order of approximation is generated, Block 73. If the approximate model for the given admittance term is sufficiently accurate, the procedure is terminated, Block 76. Otherwise, two additional moments are calculated for the next order of approximation, Blocks 74 and 75.

9.1 Operations for Performing DC Analysis, 100

Figure 10:
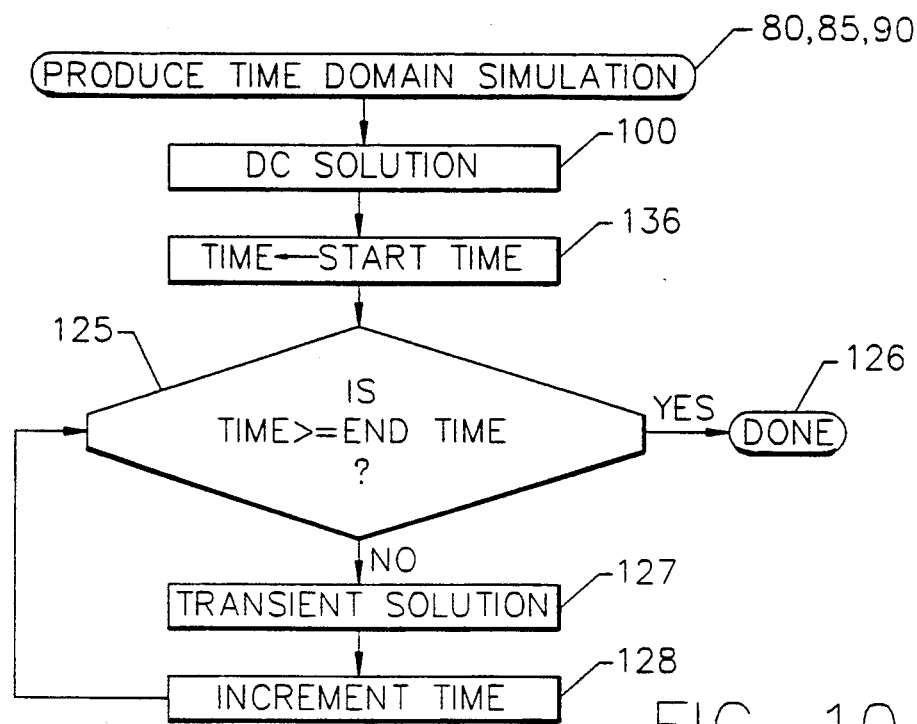
FIG. 10 illustrates the operations for performing a time domain simulation of a microelectronic circuit.
Figure 11:
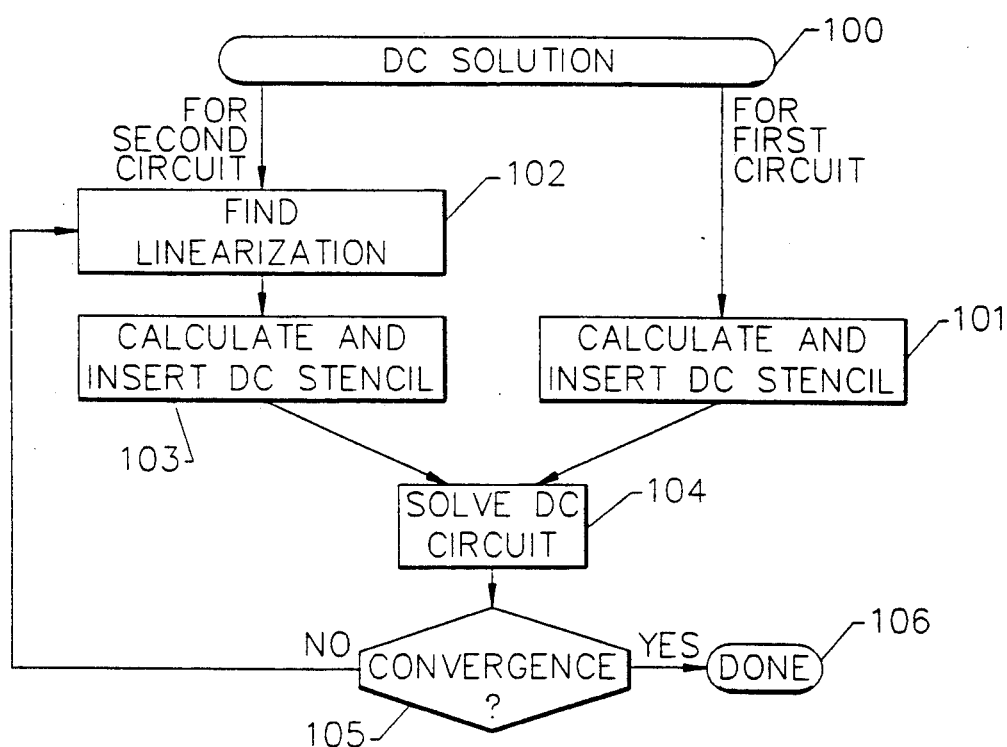
FIG. 11 illustrates the operations for determining the DC solution to a microelectronic circuit according to the operations performed in FIG. 10.

Referring now to FIG. 10, the operations for producing a time domain simulation, Blocks 80, 85, 90, begin with the performance of a DC analysis to obtain a DC solution to the microelectronic circuit containing interconnect portions therein, Block 100. As shown by FIG. 11, the operations for performing a DC analysis begin with the computation of a DC stencil for the first circuit, Block 101, and the second circuit, Block 103. The stencils obtained therefrom are then combined using techniques described in Section 9.2, and then solved using conventional techniques, Block 104. As will be understood by one skilled in the art, the nonlinear elements of the second circuit will have to be linearized, Block 102, using conventional techniques and the steps described in Section 4, for example. If the DC solution provided by Block 104 converges, the DC solution is obtained and the operation is complete, Blocks 105, 106; otherwise, another attempt at linearizing the second circuit will be performed, Block 102.

9.2 Compute Multiport Macromodel Stencils and Admittance and Current Stencils and Combine into MNA Circuit Matrix, 80, 85

In order to simulate the microelectronic circuit, both the port current and port voltage vectors must be determined for the duration of the transient simulation. At each time point $t_k$ in the simulation, the voltage vectors for all previous time points are known while the voltage vector for the time point to be simulated, $V(t_k)$ is treated as unknown. The conventional SPICE operations for computing the voltage vector incorporate a trapezoidal integration technique for all circuit elements, linear and nonlinear, not modeled using the admittance macromodels. These elements provide conductance and current stencils to the MNA circuit matrix at each time point corresponding to the $a_{ij}$ and $b_j$ terms in Equation (11), using the SPICE stencilling technique described in Section 4.

$$\begin{bmatrix} y_{11}(t_k) + a_{11} & \cdots & \cdots & \cdots & y_{1n}(t_k) + a_{1n} & \cdots & a_{1N} \\ \cdots & \cdots & \cdots & \cdots & \cdots & \cdots & \cdots \\ \cdots & \cdots & y_{ij}(t_k) + a_{ij} & \cdots & \cdots & \cdots & \cdots \\ \cdots & \cdots & \cdots & \cdots & \cdots & \cdots & \cdots \\ y_{n1}(t_k) + a_{n1} & \cdots & \cdots & \cdots & y_{nn}(t_k) + a_{nn} & \cdots & \cdots \\ \cdots & \cdots & \cdots & \cdots & \cdots & \cdots & \cdots \\ a_{N1} & \cdots & \cdots & \cdots & \cdots & \cdots & a_{NN} \end{bmatrix} \quad (11)$$

$$\begin{bmatrix} v_1(t_k) \\ \ldots \\ v_j(t_k) \\ \ldots \\ v_n(t_K) \\ \ldots \\ v_N(t_k) \end{bmatrix} = \begin{bmatrix} i_1(t_k) + b_1 \\ \ldots \\ i_j(t_k) + b_j \\ \ldots \\ i_n(t_l) + b_n \\ \ldots \\ b_N \end{bmatrix}$$

The terms $y_{ij}(t_k)$ and $i_j(t_k)$, correspond to the admittance macromodel stencils to the global MNA matrix. It is assumed that the common node of the multiport macromodel is ground, thus all port voltages are also node voltages. As provided in Equation (11), the terms of the admittance macromodels are stenciled into the MNA circuit matrix at each time simulation point.

There is a simple and direct relationship between the time and frequency domain representations of the admittance matrix. The frequency domain product corresponds in general to a time domain convolution integral to express the port current vector i(t) in terms of the port voltage vector and the admittance matrix. This relationship forms the basis upon which stencils for the admittance macromodels are determined at each time point:

$$I(t) = \int_t^0 Y(t - \tau)V(\tau)d\tau \quad (12)$$

In general the evaluation of a convolution integral becomes progressively more expensive as the simulation time increases. However, AWESpice reduces the calculation of the convolution integral to a constant cost operation, as described more fully below herein.

Figure 9A:
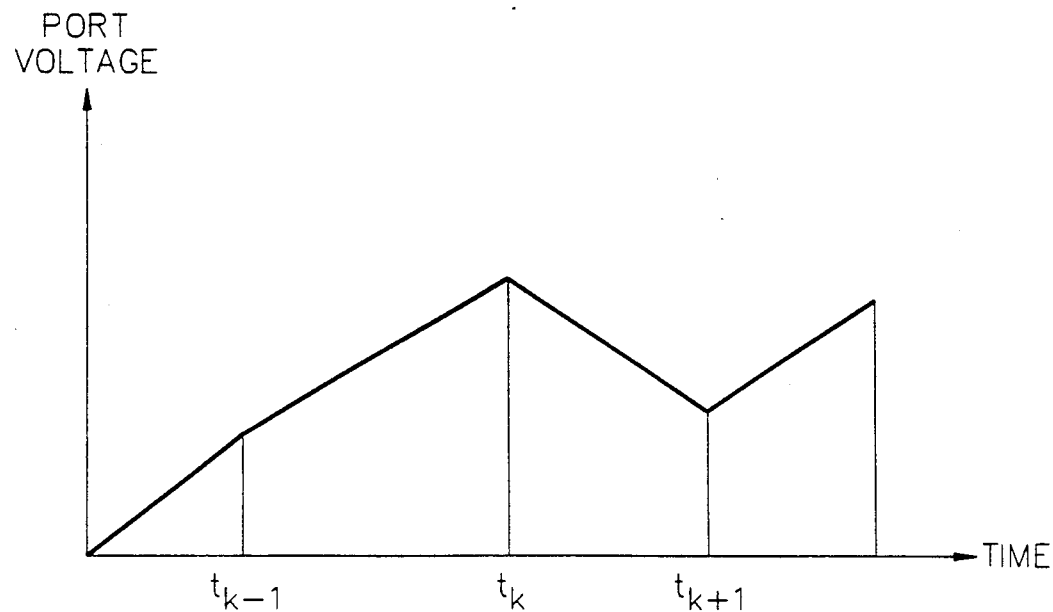
FIG. 9A illustrates a piecewise linear approximate graph of a port voltage waveform.

Each element in the admittance macromodel will contribute a stencil to both $y_{ij}(t_k)$ and $i_j(t_k)$ at time point $t_k$. The stencil contribution to $y_{ij}(t_k)$ corresponds to the unknown part of the port voltage waveform while the stencil contribution to $i_j(t_k)$ corresponds to the known part of the port voltage waveform. In the context of circuit simulation, the port voltages can be assumed to be linear functions of time between successive time steps. Thus, the port voltage waveforms are piecewise linear functions of time as shown by FIG. 9A, and can be decomposed into a set of ramps, FIG. 9B. Accordingly, at each time point $t_k$, a new ramp with a slope equal to the change in slope of the port voltage waveform at that time point can be generated. Given that at any time point $t_k$, the corresponding voltage, $v(t_k)$, is unknown, the unknown change in slope at time $t_{k-1}$, $dm_{k-1}$ is given by:

$$dm_{k-1} = \frac{v(t_k) - v(t_{k-1})}{t_k - t_{k-1}} - \frac{v(t_{k-1}) - v(t_{k-2})}{t_{k-1} - t_{k-2}} \quad (13)$$

This change of slope can be divided into known and unknown parts. The unknown part is the coefficient of $v(t_k)$ which forms part of the $y_{ij}(t_k)$ terms stencilled into the left hand side of the circuit MNA matrix, Equation 11. The known part will contribute to the current stencil $i_j(t_k)$. The known current contribution, corresponding to all known slopes, for each admittance parameter $Y_{ij}(s)$ will also contribute to the $i_j(t_k)$ terms which are stencilled into the right hand side current vector of Equation 11, at each time point ($t_k$). A recursive procedure for efficiently evaluating the exact response of the known part of the waveform requiring only a constant number of operations at each time point will now be described.

Each term in the admittance matrix, $Y_{ij}(s)$, is an AWE approximation and thus in partial fraction form. Consequently, in order to evaluate the time domain port currents, it is possible to find the frequency domain product of each ramp with each pole-residue pair in $Y_{ij}(s)$ and then find the inverse Laplace transform symbolically on a pole by pole basis.

The expression for the time domain current when a real pole-residue pair is excited by a single ramp will now be described. If m is the slope of the input voltage and $p_r$ and $k_r$ form a real pole-residue pair, the frequency domain expression for the current contribution I(s) of a single pole-residue pair corresponding to one entry of the admittance macromodel matrix is given by:

$$I(s) = \frac{m}{s^2} \times \frac{k_r}{s - p_r} \quad (14)$$

or in partial fraction form as, $$I(s) = m\left(\frac{-k_r}{p_r^2 s} + \frac{-k_r}{p_r s^2} + \frac{k_r}{p_r^2(s - p)}\right) \quad (15)$$

The inverse Laplace transform of Equation (15) can be computed as:

$$i(t) = m\left(\frac{-k_r}{p_r^2} + \frac{(-k_r)t}{p_r} + \frac{k_r}{p_r^2}e^{p_r t}\right)u(t) \quad (16)$$

Figure 9B:
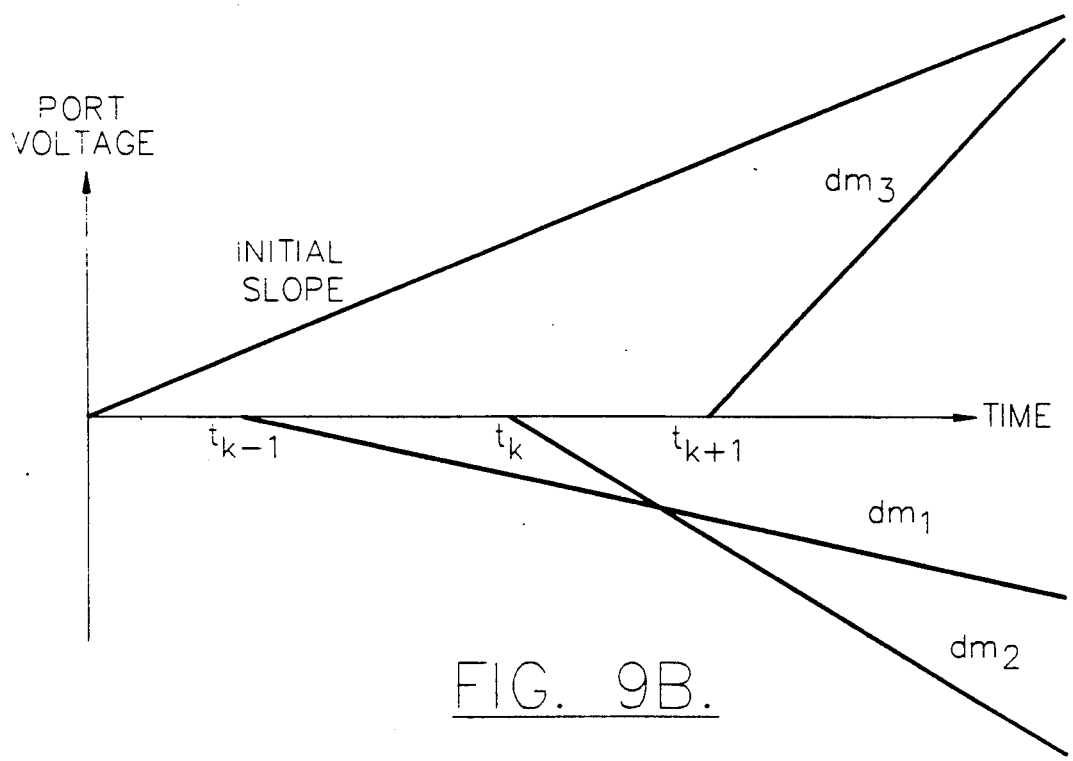
FIG. 9B illustrates a decomposed waveform representation of the waveform shown in FIG. 9A.

As recognized from these equations, the current due to a single element of the admittance macromodel matrix excited is the sum of the currents due to each individual pole-residue pair. Complex conjugate pole pairs are handled together to obtain a real time domain current. The direct coupling component of the current can also be computed in a similar manner. Given that a particular port voltage can be decomposed into a set of ramps as illustrated by FIG. 9B, a new ramp with a slope equal to change in the slope at that time step originates at each time step. Expanding on the above discussion for a single ramp case, one can compute the change in current due to a slope change dm at time $t_k$ for single real pole-residue pair to be:

$$di(t) = dm\left(\frac{-k_r}{p_r^2} + \frac{(-k_r)(t - t_k)}{p_r} + \frac{k_r}{p_r^2}e^{p_r(t - t_k)}\right)u(t - t_k) \quad (17)$$

Because the decomposed port voltage waveform consists of a large number of ramps, both computational and memory storage requirements could increase substantially as the simulation time increases. However, this problem can eliminated by preferably using a single cost operation at each time point. For example, Equation (17) can be reduced to three terms at each time point: one constant, one linear and one exponential.

Accordingly, the current contribution of the entire known portion of the time domain current expression can be evaluated as:

$$i(t) = d_{k-1} + e_{k-1}t + f_{k-1}e^{p_r(t-t_{k-1})} \quad (18)$$

for $t_{k-1} < t < t_k$. Given that $d_k$ is the coefficient of the constant term, $e_k$ is the coefficient of the linear term and $f_k$ is the coefficient of the exponential term at time $t_k$, each new change in slope at each time point will adjust the coefficients of these terms. To provide a single cost operation, the coefficients of these terms can be updated at each time point. From Equation (17), the adjustment in the coefficients of the terms, for a change in slope dm at time $t_k$, is given by:

$$d_k = d_{k-1} + dm\left(\frac{-k_r}{p_r^2} + \frac{k_r t_k}{p_r}\right) \quad (19)$$

$$e_k = e_{k-1} + dm\left(\frac{-k_r}{p_r}\right) \quad (20)$$

$$f_k = f_{k-1} e^{p_r(t_k - t_{k-1})} + dm_k \frac{k_r}{p_r^2} \quad (21)$$

The current contribution of one pole due to the known portion of the port waveform can be computed using Equations (14)–(21). The total current contribution is of course the sum of the current contribution of all the poles and the direct coupling of $Y_{ij}(s)$.

9.3 Operations for Calculating Multiport Stencil Contributions, 107

Figure 12:
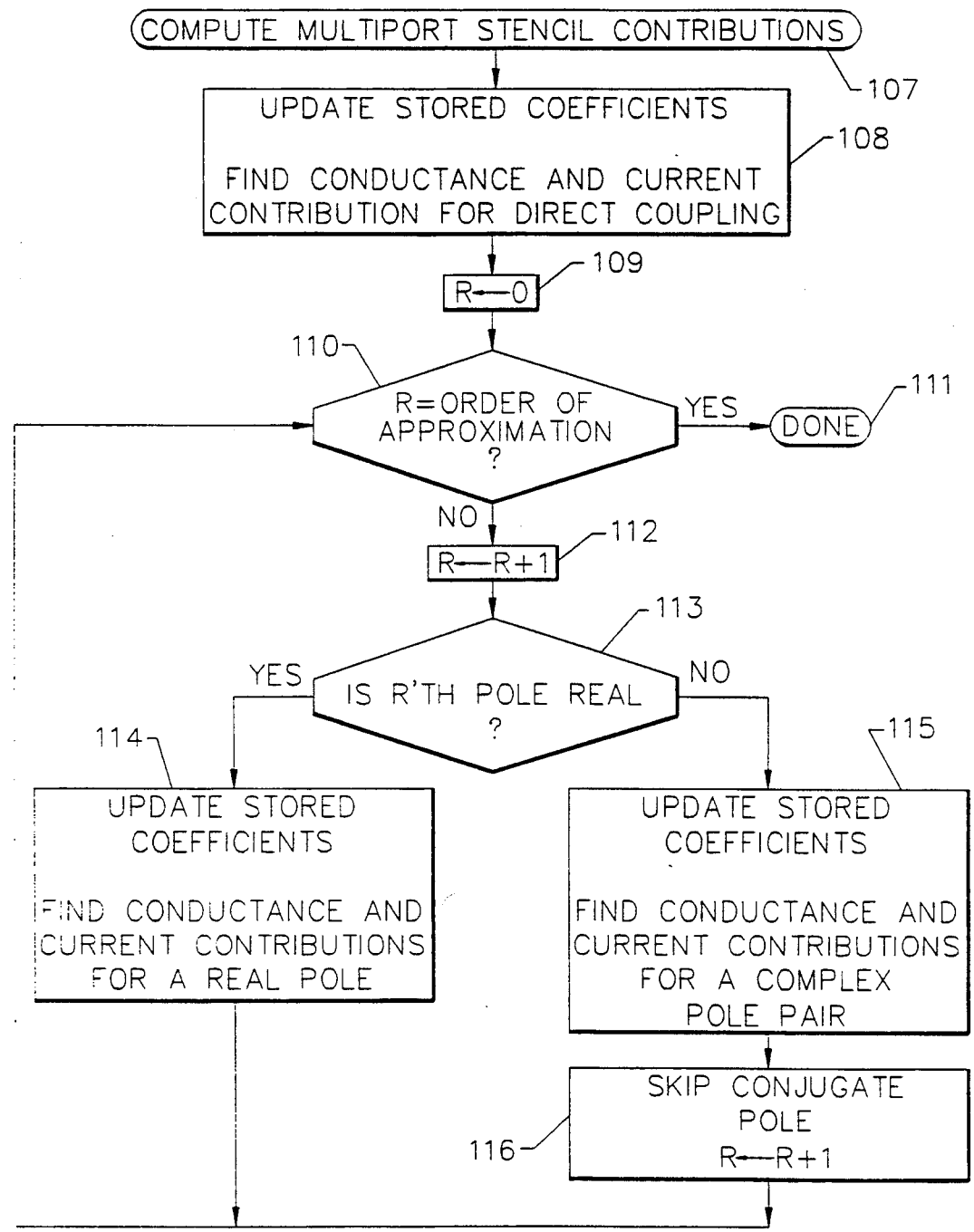
FIG. 12 illustrates the operations for computing multiport stencil contributions.

Referring now to FIG. 12, the operations for computing the multiport stencil contributions begin with the determination of the conductance and current contributions of the direct coupling terms, Blocks 107, 108. The coefficients for the $t_{k-1}$ time point are also updated, Block 108.

The value R, corresponding to the order of approximation being calculated is initially set to zero and then checked to see if the current R value equals the desired order of approximation of the particular admittance macromodel term, $y_{ij}(t)$, Blocks 109, 110. If the desired order of approximation has been reached, the operation is complete, Block 111; otherwise, the R value is incremented to correspond to the next order of approximation or next higher order pole, Block 112. If the next higher order pole is real, the coefficients $d_k$, $e_k$, and $f_k$ of Equations (19)–(21) are updated as described in Section 9.2, and the conductance and current contributions for the corresponding pole are calculated, Blocks 113 and 114. The next pole in the approximation, if there is one, is then selected and the process is repeated, Blocks 110, 112. As shown by Blocks 115 and 116, complex poles are handled similarly; however, the value R is incremented to skip the conjugate pole.

9.4 Inserting a Multiport Stencil into the Admittance Matrix, 117

Figure 13:
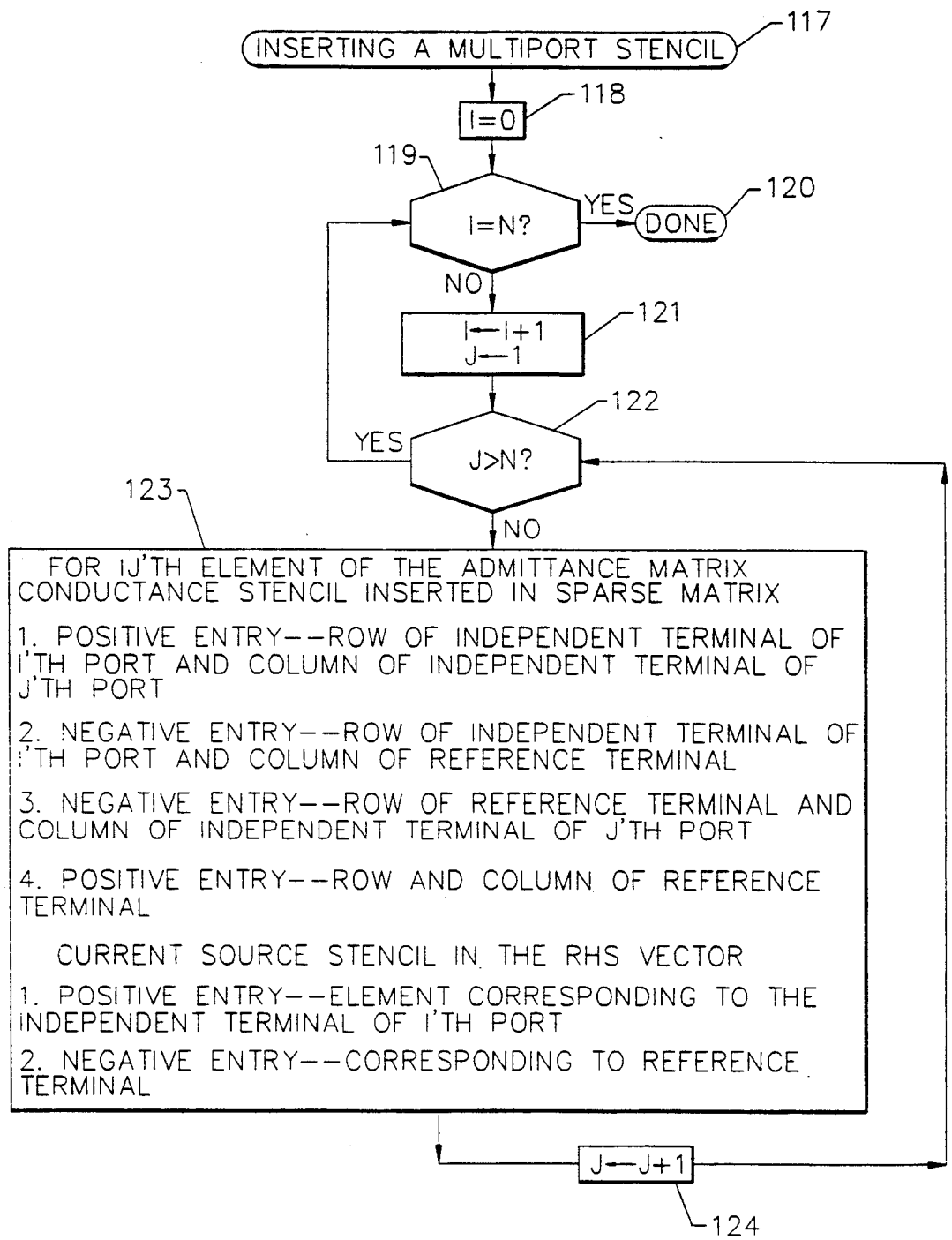
FIG. 13 illustrates the operations for inserting a multiport stencil.

Referring now to FIG. 13 and the discussion accompanying TABLE I in Section 4, the operations for inserting a multiport stencil, Block 117, will be described. The operations begin with the terms of the first row of the admittance model matrix corresponding to the first nxn partition. More particularly, the row index I is initially set to Zero (0), Block 118, and then a check is made in Block 119 to see if the last row of admittance terms has been inserted into the global matrix as stencils. If so, the process is complete, Block 120. Otherwise, the row index I is incremented, Block 121, to process the next row of terms as stencils.

As provided in Block 121, the column index J is initially set to one (1) to begin processing at the first column of macromodel terms. As shown by Block 122, the column index is checked to see if the last column for a given row has already been processed. If so, the next row is processed. Otherwise, four (4) conductance stencil terms are inserted into the global matrix and two (2) current stencil terms are added to the current source vector, as shown by Equation (11), for example.

As provided in Block 123, positive entries for the admittance term $y_{ij}$ are added to matrix locations (i,i) and (j,j) while negative values are added to the (i,j) and (j,i) terms of the global matrix. Similarly, current source stencils are provided to the current vectors and the column index J is incremented, Block 124, to correspond to the next higher order column for the selected row index I. The procedure is repeated until the stencils for a particular row have been added, then the next row is selected, Blocks 122, 119.

10. Produce Time Domain Simulation of Microelectronic Circuit, 80, 85, 90

Referring again to FIG. 10, the simulation begins at the start time, Block 136, and then is repeatedly checked during simulation to see if the end time has been reached, Block 125. If so, the simulation is complete, Block 126. Otherwise, the transient solution is obtained, Block 127, using the operations shown in FIG. 14. Once the transient solution has been obtained for a given simulation time point, the time is incremented by the user selected time step or otherwise, and the operations for determining the transient response at the next simulation time point are repeated, Block 128.

Figure 14:
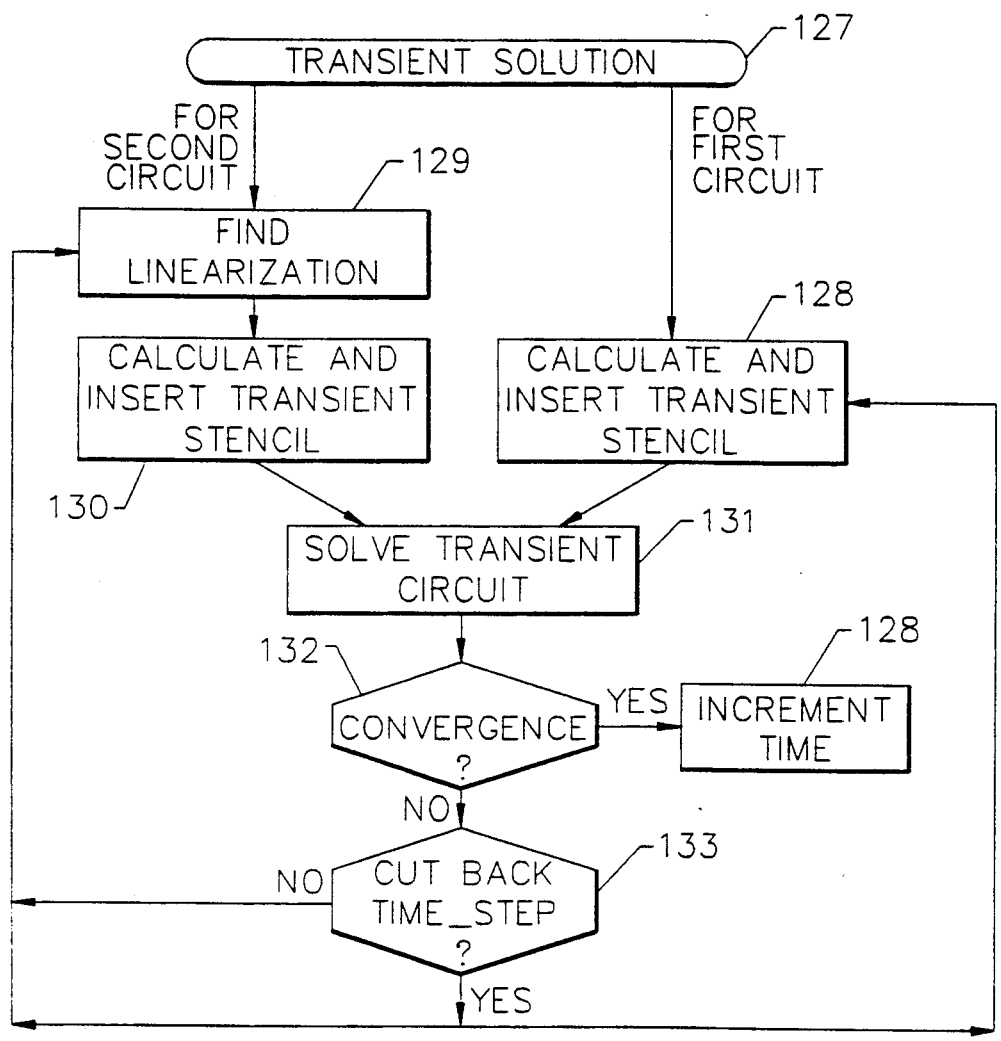
FIG. 14 illustrates the operations for determining the transient solution to a microelectronic circuit according to the operations performed in FIG. 10.

Referring now to FIG. 14, the operations for computing the transient solution corresponding to Block 127 will be described. The operations for computing and inserting the stencils for the first circuit or macromodeled linear partitions are performed using the techniques described in Sections 9.2 and 9.3, Block 128. For the second circuit containing primarily nonlinear elements, the operations begin with the formation of a linearized representation using Norton equivalent techniques described in Section 4. From the linearized version, admittance and current terms can be obtained and provided as stencils to the global MNA matrix, Blocks 130, 131.

Using conventional circuit solution techniques such as LU-factorization, the transient analysis for the entire microelectronic circuit can be obtained, Block 131. If the solution converges, Block 132, the solution is retained and the simulation time is incremented, Block 128. Otherwise, a decision is made whether to reduce the time step interval to provide convergence, Block 133. Next, the linearization step is repeated to calculate new admittance and current stencils, Block 129, and the operations are performed again until a converged solution is obtained.

In the drawings and specification, there have been disclosed typical preferred embodiments of the invention and, although specific terms are employed, they are used in a generic and descriptive sense only and not for That which is claimed:

1. A method for simulating operation of a microelectronic circuit during a time interval, said microelectronic circuit having a plurality of interconnected linear and nonlinear electronic elements, comprising the following steps performed in a computer system:
   storing a representation of said microelectronic circuit in said computer system;
   dividing the stored representation into a first circuit comprising linear elements and a second circuit comprising nonlinear elements;
   determining moments for a portion of said first circuit;
   determining poles from the moments;
   forming a multiport macromodel of said portion of said first circuit from the poles;
   forming a linearized transient representation of said second circuit; and
   combining said multiport macromodel and said linearized transient representation at time points in the time interval to produce a time domain simulation of the operation of said microelectronic circuit during the time interval.

2. The method of claim 1 wherein said combining step is followed by the steps of:
   modifying said microelectronic circuit in response to the time domain simulation of the operation of said microelectronic circuit; and
   manufacturing the modified microelectronic circuit.

3. The method of claim 1, wherein said macromodel forming step comprises the step of forming a multiport admittance macromodel of said portion of said first circuit from the poles;
   wherein the step of forming a linearized transient representation of said second circuit comprises the step of forming a linearized admittance representation of said second circuit; and
   wherein said combining step comprises the step of combining said multiport admittance macromodel and said linearized admittance representation at time points in the time interval to produce a time domain simulation of the operation of said microelectronic circuit during the time interval.

4. The method of claim 1, wherein said dividing step comprises the step of dividing the stored representation into a first circuit comprising a plurality of linear element partitions and a second circuit comprising nonlinear elements;
   wherein the step of determining moments comprises the step of determining moments for said plurality of linear element partitions;
   wherein the multiport macromodel forming step comprises the step of forming a plurality of multiport admittance macromodels of said plurality of linear element partitions; and
   wherein said combining step comprises the step of combining said plurality of multiport admittance macromodels and said linearized transient representation at time points in the time interval to produce a time domain simulation of the operation of said microelectronic circuit during the time interval.

5. The method of claim 1, wherein the step of determining poles from the moments is followed by the step of determining residues from the moments and the poles; and
   wherein the step of forming a multiport macromodel comprises the step of forming a multiport admittance macromodel from the poles and the residues.

6. The method of claim 1, wherein said combining step is preceded by the step of forming a first stencil from said multiport macromodel and forming a second stencil from said linearized transient representation; and
   wherein said combining step comprises the step of combining said first and second stencils at time points in the time interval to produce a time domain simulation of the operation of said microelectronic circuit during the time interval.

7. Apparatus for simulating operation of a microelectronic circuit during a time interval, said microelectronic circuit having a plurality of linear and nonlinear interconnected electronic elements, said apparatus comprising,
   means for storing a representation of said microelectronic circuit in a computer system;
   means, responsive to said storing means, for dividing the stored representation into a first circuit comprising linear elements and a second circuit comprising nonlinear elements;
   moment determining means, responsive to said dividing means, for determining moments for a portion of said first circuit;
   pole determining means, responsive to said moment determining means, for determining poles from the moments;
   multiport macromodel forming means, responsive to said pole determining means, for forming a multiport macromodel of said portion of said first circuit from the poles;
   linearized transient representation means, responsive to said dividing means, for forming a linearized transient representation of said second circuit;
   simulation producing means, responsive to said macromodel forming means and said linearized transient representation means, for combining said multiport macromodel and said linearized transient representation at time points in the time interval to produce a time domain simulation of the operation of said microelectronic circuit during the time interval.

8. The apparatus of claim 7, further comprising:
   means, responsive to said simulation producing means, for modifying said microelectronic circuit in response to the time domain simulation of the operation of said microelectronic circuit; and
   means, responsive to said modifying means, for manufacturing the modified microelectronic circuit.

9. The apparatus of claim 7, wherein said dividing means comprises means for dividing the stored representation into a first circuit comprising a plurality of linear element partitions and a second circuit;
   wherein said moment determining means comprises means for determining moments for said plurality of linear element partitions;
   wherein said multiport macromodel forming means comprises means for forming a plurality of multiport admittance macromodels of said plurality of linear element partitions from the poles; and
   wherein said simulation producing means comprises means for combining said multiport admittance macromodels and said linearized transient representation at time points in the time interval to produce a time domain simulation of operation of said microelectronic circuit during the time interval.

10. The apparatus of claim 7, further comprising residue determining means, responsive to said moment and said pole determining means, for determining residues from the moments and poles; and wherein said multiport macromodel forming means comprises means for forming a multiport admittance macromodel of said portion of said first circuit from the poles and residues.

11. The apparatus of claim 7, wherein said simulation producing means comprises:

means for forming a first stencil from said multiport macromodel;

means for forming a second stencil from said linearized transient representation; and means for combining said first and second stencils at time points in the time interval to produce a time domain simulation of the operation of said microelectronic circuit during the time interval.

12. Apparatus for simulating operation of a microelectronic circuit during a time interval, said microelectronic circuit having a plurality of interconnected linear and nonlinear electronic elements, said apparatus comprising:

means for storing a representation of said microelectronic circuit in a computer system;

means, responsive to said storing means, for dividing the stored representation into a first circuit comprising linear elements and a second circuit comprising nonlinear elements;

asymptotic waveform evaluation means, responsive to said dividing means, for forming a multiport admittance macromodel of a portion of said first circuit;

linearized transient representation means, responsive to said storing and dividing means, for forming a linearized transient representation of said second circuit; and simulation producing means, responsive to said asymptotic waveform evaluation means and said linearized transient representation means, for combining said multiport admittance macromodel and said linearized transient representation at time points in the time interval to produce a time domain simulation of the operation of said microelectronic circuit during the time interval.

13. The apparatus of claim 12, further comprising:

means, responsive to said simulation producing means, for modifying said microelectronic circuit in response to the time domain simulation of the operation of said microelectronic circuit; and means, responsive to said modifying means, for manufacturing the modified microelectronic circuit.

14. The apparatus of claim 12, wherein said dividing means comprises means for dividing the stored representation into a first circuit comprising a plurality of linear element partitions and a second circuit;

wherein said asymptotic waveform evaluation means comprises means for forming a plurality of multiport admittance macromodels of said plurality of linear element partitions; and wherein said simulation producing means comprises means for combining said plurality of multiport admittance macromodels and said linearized transient representation at time points in the time interval to produce a time domain simulation of the operation of said microelectronic circuit during the time interval.

15. The apparatus of claim 12, further comprising means responsive to said asymptotic waveform evaluation means, for forming a first stencil from said multiport macromodel and for forming a second stencil from said linearized transient representation; and wherein said simulation producing means comprises means for combining said first and second stencils at each time point to produce the time domain simulation of the operation of said microelectronic circuit during the time interval.

16. A method for simulating operation of a microelectronic circuit during a time interval, said microelectronic circuit having a plurality of interconnected linear and nonlinear electronic elements, comprising the following steps performed in a computer system:

storing a representation of said microelectronic circuit in said computer system;

dividing the stored representation into a first circuit comprising linear elements and a second circuit comprising nonlinear elements;

forming a multiport macromodel of a portion of said first circuit;

forming a linearized transient representation of said second circuit; and combining said multiport macromodel and said linearized transient representation at time points in the time interval to produce a time domain simulation of the operation of said microelectronic circuit during the time interval.

17. The method of claim 16 wherein said combining step is followed by the steps of:

modifying said microelectronic circuit in response to the time domain simulation of the operation of said microelectronic circuit; and manufacturing the modified microelectronic circuit.

18. The method of claim 16, wherein said macromodel forming step comprises the step of forming a multiport admittance macromodel of said portion of said first circuit;

wherein the step of forming a linearized transient representation of said second circuit comprises the step of forming a linearized admittance representation of said second circuit; and wherein said combining step comprises the step of combining said multiport admittance macromodel and said linearized admittance representation at time points in the time interval to produce a time domain simulation of the operation of said microelectronic circuit during the time interval.

19. The method of claim 16, wherein said dividing step comprises the step of dividing the stored representation into a first circuit comprising a plurality of linear element partitions and a second circuit comprising nonlinear elements;

wherein the multiport macromodel forming step comprises the step of forming a plurality of multiport admittance macromodels of said plurality of linear element partitions; and wherein said combining step comprises the step of combining said plurality of multiport admittance macromodels and said linearized transient representation at time points in the time interval to produce a time domain simulation of the operation of said microelectronic circuit during the time interval.

20. The method of claim 16, wherein said combining step is preceded by the step of forming a first stencil from said multiport macromodel and forming a second stencil from said linearized admittance representation; and wherein said combining step comprises the step of combining said first and second stencils at time points in the time interval to produce a time domain simulation of the operation of said microelectronic circuit during the time interval.

21. Apparatus for simulating operation of a microelectronic circuit during a time interval, said microelectronic circuit having a plurality of interconnected linear and nonlinear electronic elements, said apparatus comprising:

Asymptotic Waveform Evaluation (AWE) means, for producing a model of a portion of said linear electronic elements;

means, responsive to said Asymptotic Waveform Evaluation means, for converting said model of said portion of linear electronic elements into a SPICE compatible representation; and SPICE means, responsive to said converting means, for producing a time domain simulation of said microelectronic circuit from said nonlinear electronic elements and said SPICE compatible representation.

22. A method for simulating operation of a microelectronic circuit during a time interval, said microelectronic circuit having a plurality of interconnected linear and nonlinear electronic elements, comprising the steps of:

producing a model of a portion of said linear electronic elements;

converting said model of said portion of linear electronic elements into a SPICE compatible representation; and providing said SPICE compatible representation and said nonlinear electronic elements to SPICE to produce a time domain simulation of said microelectronic circuit from said nonlinear electronic elements and said SPICE compatible representation.

23. Apparatus for simulating operation of a microelectronic circuit during a time interval, said microelectronic circuit having a plurality of interconnected linear and nonlinear electronic elements, said apparatus comprising:

means for storing a representation of said microelectronic circuit in a computer system;

means, responsive to said storing means, for dividing the stored representation into a first circuit comprising linear elements and a second circuit comprising nonlinear elements;

Asymptotic Waveform Evaluation (AWE) means, for producing a model of a portion of said linear elements;

means, responsive to said Asymptotic Waveform Evaluation means, for converting said model into a SPICE stencil; and SPICE means, responsive to said converting means, for producing an operational model of said microelectronic circuit from said nonlinear electronic elements and said SPICE stencil.

24. A method for simulating operation of a microelectronic circuit during a time interval, said microelectronic circuit having a plurality of interconnected linear and nonlinear electronic elements, comprising the steps of:

storing a representation of said microelectronic circuit in a computer system;

dividing the stored representation into a first circuit comprising linear elements and a second circuit comprising nonlinear elements;

producing a model of a portion of said linear elements;

converting said model into a SPICE stencil; and providing said SPICE stencil and said nonlinear electronic elements to SPICE to produce an operational model of said microelectronic circuit from said nonlinear electronic elements and said SPICE stencil.

* * * * *